US012221685B2

(12) United States Patent
Sopchak

(10) Patent No.: US 12,221,685 B2
(45) Date of Patent: Feb. 11, 2025

(54) DIAMOND-LIKE CARBON MATERIALS AND METHODS OF MAKING DIAMOND-LIKE CARBON MATERIALS

(71) Applicant: Coulombic, Inc., Oakland, CA (US)

(72) Inventor: David Andrew Sopchak, Oakland, CA (US)

(73) Assignee: Coulombic, Inc., Oakland, CA (US)

( * ) Notice: Subject to any disclaimer, the term of this patent is extended or adjusted under 35 U.S.C. 154(b) by 16 days.

(21) Appl. No.: 18/121,783

(22) Filed: Mar. 15, 2023

(65) Prior Publication Data

US 2023/0295792 A1  Sep. 21, 2023

Related U.S. Application Data

(60) Provisional application No. 63/320,481, filed on Mar. 16, 2022.

(51) Int. Cl.
C23C 14/06 (2006.01)
C01B 32/25 (2017.01)
C01B 32/26 (2017.01)
C23C 14/34 (2006.01)
C23C 14/35 (2006.01)

(52) U.S. Cl.
CPC .......... C23C 14/0611 (2013.01); C01B 32/25 (2017.08); C01B 32/26 (2017.08); C23C 14/3407 (2013.01); C23C 14/35 (2013.01)

(58) Field of Classification Search
CPC . C23C 14/0611; C23C 14/3407; C23C 14/35; C01B 32/26; C01B 32/25
See application file for complete search history.

(56) References Cited

U.S. PATENT DOCUMENTS

| | | | |
|---|---|---|---|
| 3,915,745 | A | 10/1975 | Ikeda et al. |
| 4,551,220 | A | 11/1985 | Oda et al. |
| 5,242,765 | A | 9/1993 | Naimer et al. |
| 5,618,392 | A | 4/1997 | Furuya |
| 5,624,718 | A | 4/1997 | Dearnaley |
| 6,607,642 | B1 | 8/2003 | Kiesele et al. |
| 7,033,691 | B2 | 4/2006 | Mardilovich et al. |
| 7,045,234 | B2 | 5/2006 | Mardilovich et al. |
| 7,348,087 | B2 | 3/2008 | Kearl et al. |

(Continued)

FOREIGN PATENT DOCUMENTS

| | | | | |
|---|---|---|---|---|
| CN | 106947940 A | * | 7/2017 | ......... C23C 14/0605 |
| CN | 107022761 A | * | 8/2017 | ............. C23C 14/06 |

(Continued)

OTHER PUBLICATIONS

Kim, Electrochemical Properties of Graphite-based Electrodes for Redox Flow Batteries, Bull. Korean Chem. Society, No. 2, 2011, vol. 32, pp. 571-575.

(Continued)

*Primary Examiner* — Wayne A Langel
(74) *Attorney, Agent, or Firm* — Amundsen Davis, LLC

(57) ABSTRACT

Diamond-like carbon materials and methods of making diamond-like carbon materials are provided. The diamond-like carbon materials are made and tested to specific desirable properties of conductivity and overpotential for undesired reactions. Methods of making the diamond-like carbon include sputtering using a DC magnetron, where the sputtering gas includes argon and nitrogen.

8 Claims, 14 Drawing Sheets

(56) References Cited

U.S. PATENT DOCUMENTS

| | | | |
|---|---|---|---|
| 7,352,584 | B1 | 4/2008 | Sung |
| 7,463,917 | B2 | 12/2008 | Martinez |
| 7,981,560 | B2 | 7/2011 | Kearl et al. |
| 10,941,500 | B1 * | 3/2021 | Myrick .................. C25D 5/10 |
| 2005/0109262 | A1 | 5/2005 | Linares et al. |
| 2006/0261349 | A1 | 11/2006 | Doering et al. |
| 2009/0173015 | A1 | 7/2009 | Keshavan et al. |
| 2009/0176148 | A1 | 7/2009 | Jiang et al. |
| 2009/0258255 | A1 | 10/2009 | Terashima et al. |
| 2011/0183232 | A1 | 7/2011 | Tsou et al. |
| 2012/0097458 | A1 | 4/2012 | Voronin et al. |
| 2013/0280625 | A1 | 10/2013 | Shimamune et al. |
| 2015/0376532 | A1 * | 12/2015 | Hovsepian .......... C10M 103/04 204/192.15 |
| 2020/0354826 | A1 * | 11/2020 | Harkness, IV .......... C23C 14/34 |

FOREIGN PATENT DOCUMENTS

| | | | | |
|---|---|---|---|---|
| CN | 108396306 | A * | 8/2018 | ......... C23C 14/0036 |
| CN | 106929800 | B * | 2/2019 | ......... C23C 14/0057 |
| CN | 110106483 | A * | 8/2019 | ........... C23C 14/022 |
| CN | 110218971 | A * | 9/2019 | ........ C23C 14/0036 |
| CN | 110592531 | A * | 12/2019 | ........... C23C 14/024 |
| CN | 112210752 | A * | 1/2021 | ........... C23C 14/024 |
| CN | 112779516 | A * | 5/2021 | ........ A61M 37/0015 |
| KR | 20110115283 | A * | 10/2011 | ............. C23C 14/06 |
| WO | 0074637 | | 12/2000 | |
| WO | 03077333 | | 9/2003 | |
| WO | 2014013433 | | 1/2014 | |
| WO | WO-2018113053 | A1 * | 6/2018 | ............. B82Y 30/00 |

OTHER PUBLICATIONS

English Abstract of JP 2001-348296 published Dec. 18, 2001.
English Abstract of JP 2004-119019 published Apr. 15, 2004.
Wen et al., Air Electrode for the Lithium-Air Batteries: Materials and Structure Designs, ChemPlusChem Reviews, 2015, 80, pp. 270-287.
Liang et al., A Stable electrolyte makes a nonaqueous Li—O2 battery truly rechargeable, New J. Chem., 2013, 37, pp. 2568-2572.
Kato et al., Diamond foam electrodes for electrochemical applications, Electrochemistry Communications, 2013, 33, pp. 88-91.
Wang et al., To draw an air electrode of a Li-air battery by pencil, Energy Environ. Sci., 2011, 4, pp. 1704-1707.
Yoo et al., Fe phthalocyanine supported by graphene nanosheet as catalyst in Li-air Batter with the hybrid electrolyte, Journal of Power Sources, 2013, 244, pp. 429-434.
Yang et al., Nanostructured Diamond Like Carbon Thin Film Electrodes for Lithium Alr Batteries, Journal of the Electrochemical Society, 2011, 158(10), pp. B1211-B1216.
Li et al., MnO2 nanoflakes coated on multi-walled carbon nanotubes for rechargeable lithium-air batteries, Electrochemistry Communication, 2011, 13, pp. 698-700.
Ein-Eli et al., Rechargeable Lithium-Air Batteries . . . Fame or Shame? are Lithium-Air Batteries Overhyped?, Department of Materials Science and Engineering, Technion—Israel Institute of Technology, Haifa 3200003 Israel, pp. 1-41.
Li et al., Nitrogen-doped carbon nanotubes as cathode for lithium-air batteries, Electrochemistry Communications, 2011, 13, pp. 668-672.
Akhtar et al., Porspects, challenges, and Latest developments in lithium-air batteries, Int. J. Energy Res., 2015, 39, pp. 303-316. Also published online Jul. 14, 2014 in Wiley Online Library (wileyonlinelibrary.com).
Peng et al., A Reversible and Higher-Rate Li—O2 Battery, Science, Aug. 3, 2012, vol. 337, pp. 563-566.
Peled et al., Sodium-Air Batteries for EV Applications, School of Chemistry Tel Aviv University, Tel Aviv, Israel, 3rd Israeli Power Sources Con. May 29-30, 2013, Herzelia, Israel, pp. 1-39.
Ohkuma et al., Stability of carbon electrodes for aqueous lithium-air secondary batteries, Journal of Power Sources, 2014, 245, pp. 947-952.
Grande et al., The Lithium/Air Battery: Still an Emerging System or a Practical Reality?, Adv. Mater, 2015, 27, pp. 784-800.
Beyer et al., Thermal and electrochemical decomposition of lithium peroxide in non-catalyzed carbon cathodes for Li-air batteries, Phys. Chem. Chem. Phys., 2013, 15, pp. 11025-11037.
Krall, Diamonox Model 40, Advanced Diamond Technologies, Inc., 2012, pp. 1-14.
https://pcs-instruments.com/articles/the-science-behind-diamond-like-coatings-dlcs/, Dec. 3, 2021 (8 pages).

* cited by examiner

DIAMOND-LIKE CARBON MATERIALS AND METHODS OF MAKING DIAMOND-LIKE CARBON MATERIALS

FIELD OF THE INVENTION

The present technology relates to diamond-like carbon materials, and methods of making diamond-like carbon materials.

BACKGROUND

Diamond-like carbon is term used to refer to natural or synthetic diamond, and any other form of carbon having at least some of the properties of natural or synthetic diamond, having a significant amount of $sp^3$ bonded carbon. Various forms of diamond-like carbon differ in content with respect to amounts of $sp^3$ bonded carbon and graphitic $sp^2$ carbon, and can include hydrogen in its matrix, be doped with nitrogen or other dopants, and contain fillers.

As described in U.S. Pat. No. 9,831,503, diamond-like carbon can be used in electrodes for an electrolytic cell of a battery or fuel cell or related electrochemical cells. For example, diamond-like carbon can be used in dual use gas diffusion-gas evolution electrodes.

SUMMARY OF THE INVENTION

Diamond-like carbon materials and methods of making diamond-like carbon materials are provided herein.

In one aspect, a diamond-like carbon material is provided that has good electrical conductivity and high electrochemical overpotential. Specifically, the electrical conductivity and electrochemical performance of a film of such diamond like carbon is such that a cyclic voltammogram of ruthenium hexaamine cation would have a peak separation of 100 mV or less when extrapolated to zero scan rate. Additionally, a cyclic voltammogram of hydroquinone, performed on such diamond-like carbon would have a peak separation of greater than about 500 millivolts, when extrapolated to zero scan rate.

In a second aspect, a method of making a diamond-like carbon material is provided. The method includes a step of placing a graphite target in DC magnetron located in a vacuum chamber. The method also includes sputtering material from the target onto a substrate using a sputtering gas containing argon and a dopant, to create a sputtered diamond-like material. In some examples using nitrogen as the dopant, the amount of dopant is at least about 50%. The method further includes testing the electrical conductivity of the sputtered diamond-like material by conducting cyclic voltammetry using ruthenium hexaamine cation, and separately, hydroquinone. Finally, the method includes selecting sputtered diamond-like material having (1) electrical conductivity such that voltammetry of ruthenium hexaamine cation has a peak separation when extrapolated to a scan rate of zero, that is below about 100 millivolts, and (2) overpotential such that graphed results of the cyclic voltammetry using hydroquinone having a peak separation when extrapolated to a scan rate of zero that is greater than about 500 millivolts.

BRIEF DESCRIPTION OF THE DRAWINGS

Specific examples have been chosen for purposes of illustration and description, and are shown in the accompanying drawings, forming a part of the specification.

DETAILED DESCRIPTION

Throughout this specification and the appended claims, the following terms have the meanings set forth as indicated below, which is believed to be consistent with how these terms would be understood by one of ordinary skill in the art:

Overpotential: The additional potential beyond the thermodynamic equilibrium required to drive a reaction at a certain rate. Overpotential is an absolute quantity, and is required to some degree for any electrode driving a reaction in either direction-oxidation or reduction.

Inner-sphere reaction: A reaction between an electrode and a species that has a strong interaction of the reactant, intermediates or products with the electrode. Such reactions involve specific adsorption of species involved in the electrode reaction. An inner-sphere reaction could also involve a specifically adsorbed ion or ligand that serves as a ligand bridge to a metal ion.

Outer-sphere reaction: A reaction between an electrode and a species where the reactants and products do not interact strongly with the electrode surface. Such reactions are generally at a distance of at least a solvent layer away from the electrode.

Diamond-like carbon (DLC) materials of the present technology include, but are not limited to, nitrogen doped diamond-like carbon (N-DLC).

Diamond-like carbon materials of the present technology may be made using magnetron sputtering techniques. Other methods may also be suitable for making diamond-like carbon materials of the present technology.

Figure 1:
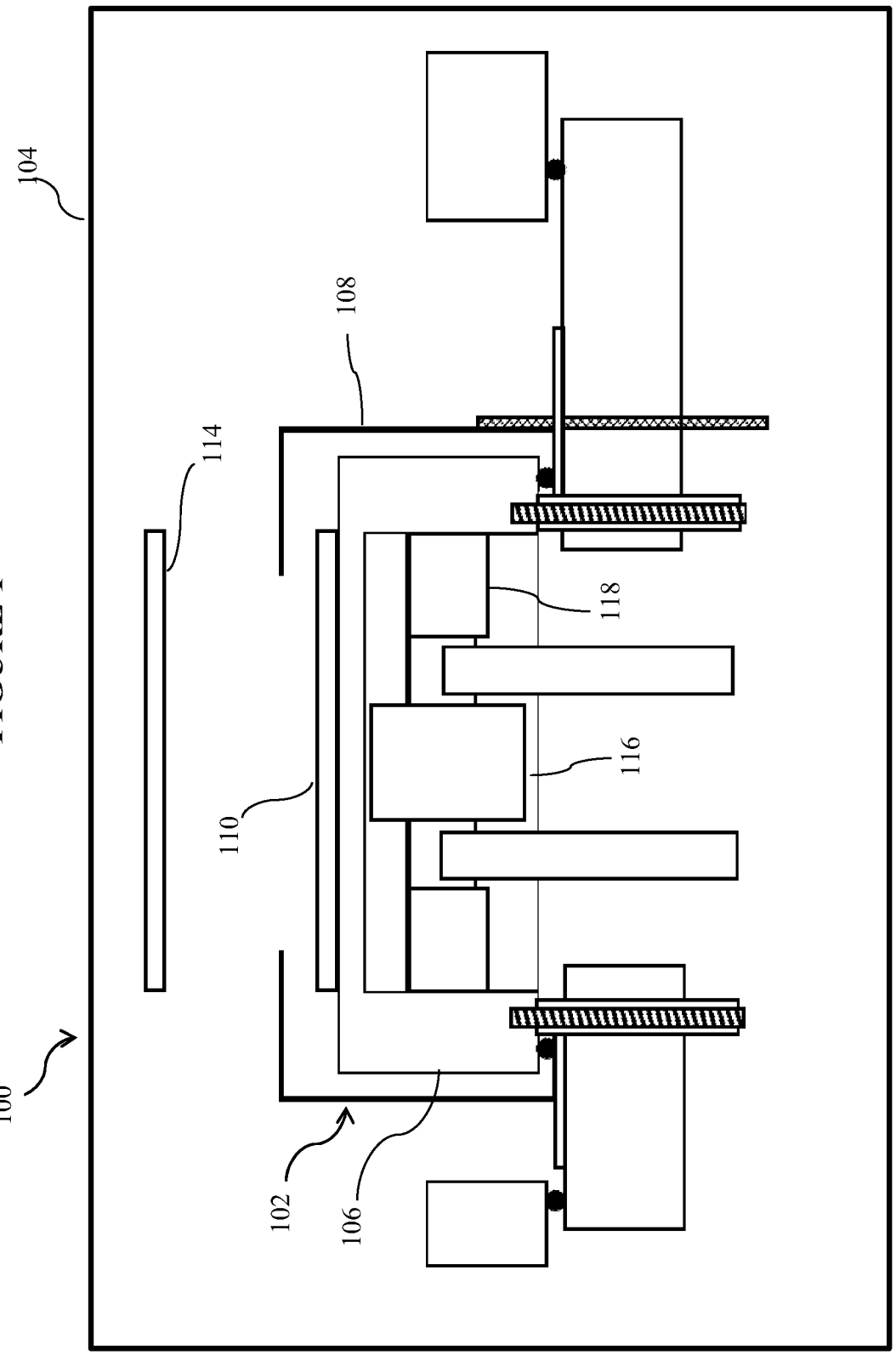
FIG. 1 illustrates a magnetron system that can be used to make diamond-like carbon materials of the present technology.
Figure 2:
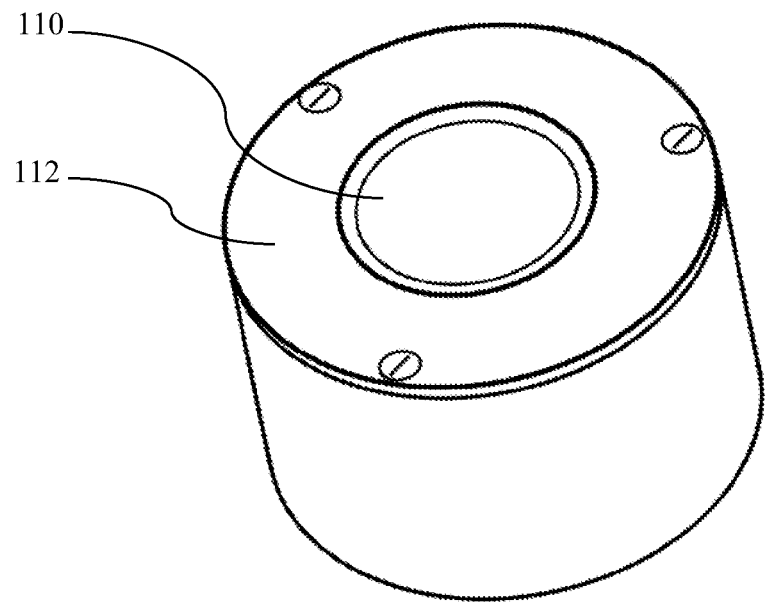
FIG. 2 illustrates a graphite target on a magnetron body of a magnetron system of FIG. 1.
Figure 3:
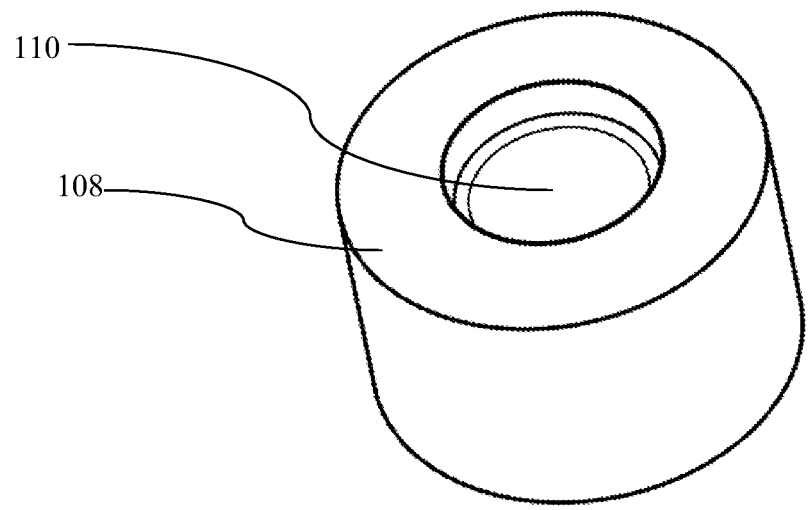
FIG. 3 illustrates an anode shell in place over the graphite target of FIG. 2.

FIGS. 1-3 illustrate a magnetron system 100 for use in creating diamond-like carbon (DLC) materials of the present technology. The system includes a DC magnetron 102 set up on a vacuum chamber 104. The DC magnetron 102 includes a magnetron body 106 and an anode shell 108. A graphite target 110 is placed on the magnetron body 106. A retaining ring 112 may be used to keep the graphite target 110 in place. The anode shell 108 is installed over the magnetron body 106. A substrate 114 is placed above the graphite target 110 to receive the sputtered material.

The magnetron body 106 of the DC magnetron 102 has a disk magnet 116 and a ring magnet 118. The disk magnet 116 and ring magnet 118 are concentric, with the ring magnet 118 surrounding the disk magnet 116. The DC magnetron 102 is an unbalanced magnetron, meaning that the magnetic field that permeates through the graphite target does not completely loop back on itself, and results in a plasma column that rises above the target to the substrate. Without being bound by any particular theory, it is believed that using an unbalanced magnetron allows the carbon ions to stay ionized all the way to their trip to the substrate, which may increase sputtering deposition rates.

Argon gas is used as the sputtering gas in the chamber along with an appropriate amount of dopant, such as nitrogen or another dopant, at least a portion of which may get incorporated into the sputtered film during the process. In at least some preferred examples of sputtering techniques as described herein using nitrogen, the amount of nitrogen may be at least about 50%, such as being 50% or greater than 50%. For example, the amount of nitrogen may be about 50%, about 55%, about 60%, about 65%. About 70%, about 75%, about 80%, about 85%, about 90%, about 95%, about 98%, or even about 100%. In other examples, the amount of dopant may be dependent upon the type of synthesis method used, or may not be required at all.

The sputtering is conducted at a suitable sputtering pressure. Depending upon the type of sputtering, the sputtering pressure may be form about 0.1 millitorr to about 50 millitorr. In at least some examples using a magnetron, such as the sputtering techniques described herein, the sputtering pressure may be about 5 millitorr.

In at least some examples, the substrate 114 may be made of aluminum. As shown in FIG. 1, the substrate 114 is an aluminum disk. During sputtering, the substrate 114 is coated with the DLC material, the sputtered coating may then be removed from the substrate 114 and used in an end application, such as being used in a lithium air battery.

In other examples, such as when making N-DLC films for basic electrochemical testing, the substrate 114 may be made of silicon. A silicon wafer may be sputter cleaned before deposition by biasing it at a negative potential versus the magnetron anode. After the silicon wafer has been sputter cleaned, the bias voltage to the substrate 114 can be turned off and the DLC film can be sputtered onto the substrate 114.

Figure 4:
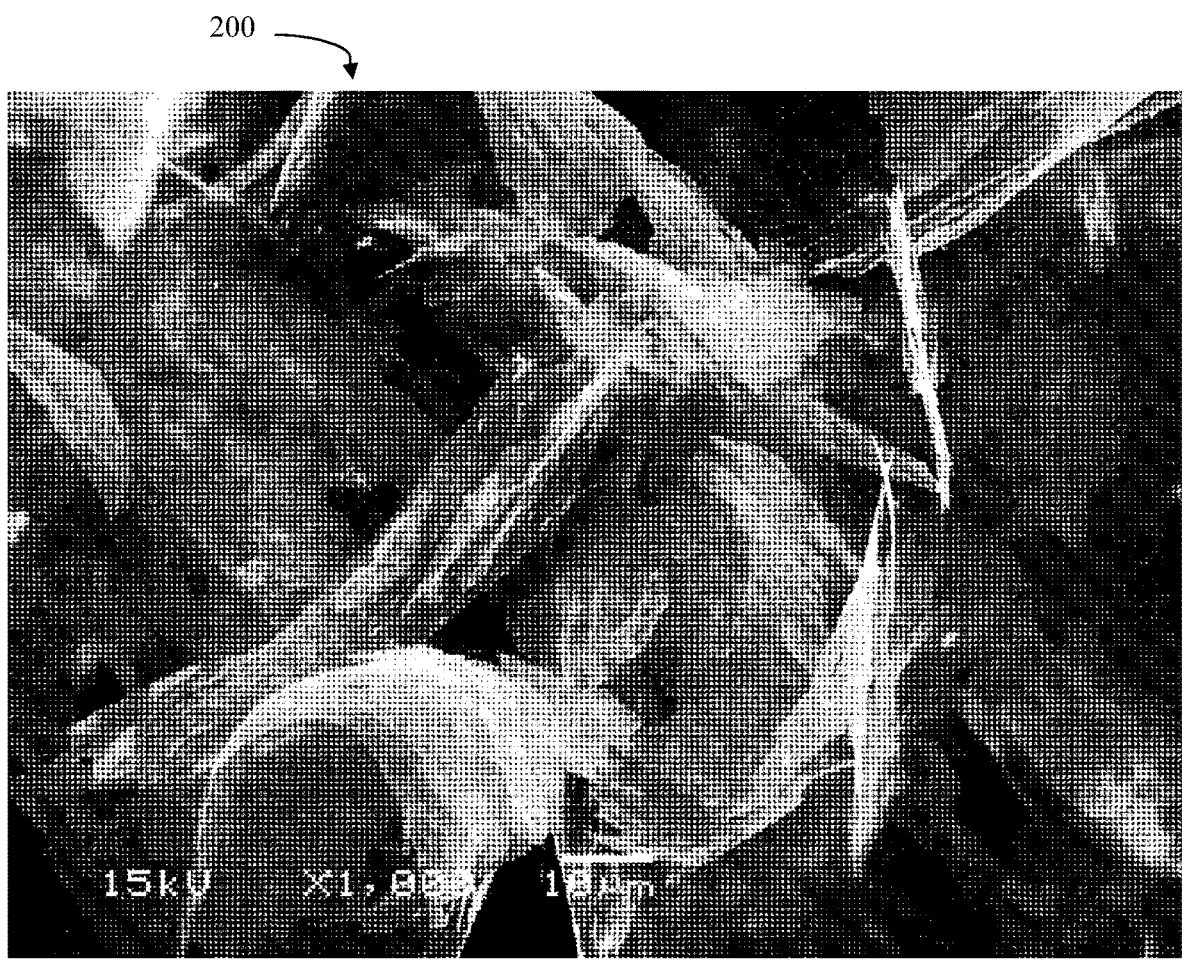
FIG. 4 illustrates one example of a diamond-like carbon (DLC) material of the present technology.

FIG. 4 illustrates one example of a diamond-like carbon (DLC) material 200 of the present technology. The DLC material 200 is a nitrogen doped diamond-like carbon (N-DLC) material. The DLC material 200 was made using a magnetron sputtering technique as described above, and as described below with respect to FIG. 15, using 25% nitrogen, a sputtering pressure of 5 millitorr, and a silicon sputtering substrate.

In at least some embodiments, N-DLC materials of the present technology may be used in an air electrode of a lithium air battery. Ideally, any air electrode materials should not allow side reactions such as oxidation or reduction of the solvents or electrolyte in the battery. However, the air electrode materials should allow the reduction of oxygen gas on discharge, and the oxidation of lithium peroxide on recharge. In order to be suitable for use in an air electrode of a lithium air battery, an N-DLC material must have certain properties.

First, N-DLC of the present technology should have a good electrical conductivity, as demonstrated by having a reversible shape in the graphed results of cyclic voltammetry using ruthenium hexaamine cation. There may be a peak separation approaching the theoretical peak separation of 59 mV for a reversible reaction. Good electrical conductivity may also be shown by the graphed results of cyclic voltammetry using ruthenium hexaamine cation having a peak separation when extrapolated to a scan rate of zero that is below about 100 millivolts.

Cyclic voltammetry is a known technique where a potential is applied to an electrode in solution and the current required to maintain that potential is measured. The potential is swept back and forth at a certain rate (usually less than a volt per second) and the current that is required to maintain that voltage sweep are plotted on a graph, known as a cyclic voltammogram. During cyclic voltammetry one electron is transferred to or from the electrode to the ruthenium hexaamine cation with no other steps involved or specific interaction with the electrode surface. These types of reaction can be referred to as being outer sphere reactions. The equations for the reactions with respect to the ruthenium hexaamine cation are as follows:

$[Ru(NH_3)_6]^{3+} + 1 \text{ electron} = [Ru(NH_3)_6]^{2+}$

$[Ru(NH_3)_6]^{2+} - 1 \text{ electron} = [Ru(NH_3)_6]^{2+}$

Generally, the reduction and oxidation of the ruthenium hexaamine cation behaves the same, regardless of what electrode is used to perform the reactions. The electrical conductivity of the electrode material will affect the shape of the curve and the peak separation. If the electrode is resistive, the peak separation will be spread out at higher scan rates/higher currents.

Figure 5:
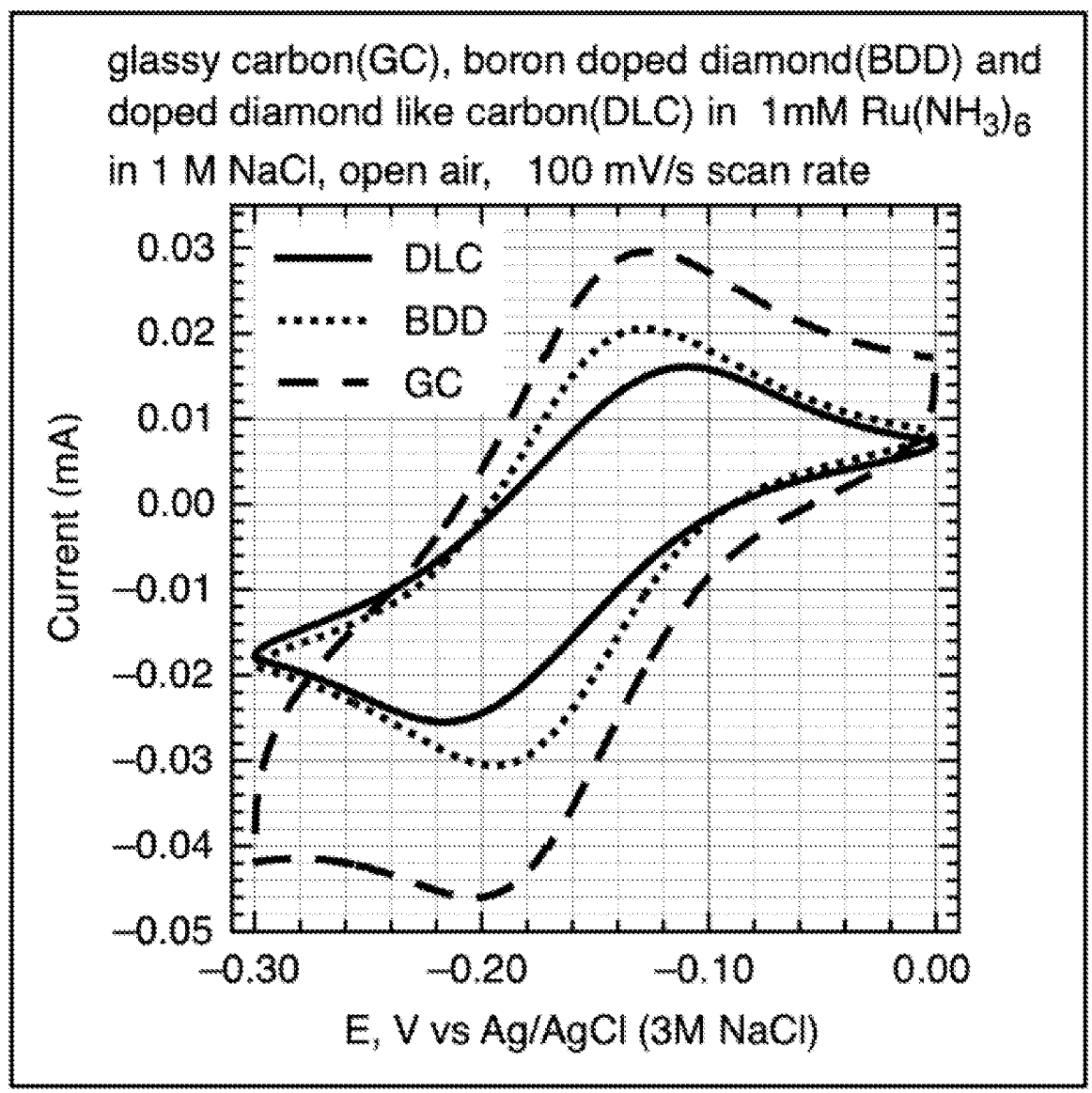
FIG. 5 illustrates a cyclic voltammogram using ruthenium hexaamine cation for a first set of example materials, including a first glassy carbon, a first boron doped diamond and a first N-DLC material of the present technology.

FIG. 5 shows a cyclic voltammogram using ruthenium hexaamine cation for glassy carbon, boron doped diamond and an N-DLC of the present technology. As shown, each of the curves has a reversible shape.

Second, N-DLC of the present technology should have a high overpotential for undesirable reactions, such as solvent breakdown in a battery. High overpotential may be demonstrated by having an irreversible shape in a voltammogram obtained by testing the N-DLC using hydroquinone. High overpotential may also be demonstrated by the graphed results of cyclic voltammetry using hydroquinone having a peak separation when extrapolated to a scan rate of zero that is greater than about 500 millivolts.

Hydroquinone (1,4-dihydroxy benzene) is a well known compound in electrochemistry which can undergo an oxidation in solution to quinone. The reaction is reversible, and quinone can be reduced in solution to hydroquinone via the opposite reaction. The reactions are shown below:

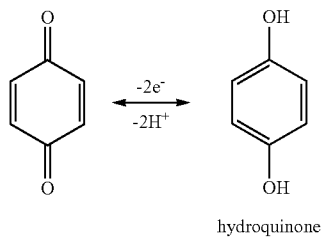 [SMILES: O=C1C=CC(=O)C=C1 ; Oc1ccc(O)cc1]

hydroquinone

Both of these reactions require multiple steps and the release or use of acid. Because of this, the properties of the electrode will have an effect on the ease at which these reactions occur. These types of reaction can be referred to as being inner-sphere reactions. In such reactions, a non-interactive electrode material, like boron doped diamond, will require a greater overpotential to get the reactions to go, since the intermediates in the reaction have to stay in contact long enough for the whole reaction to take place, otherwise the reaction won't complete.

Figure 6:
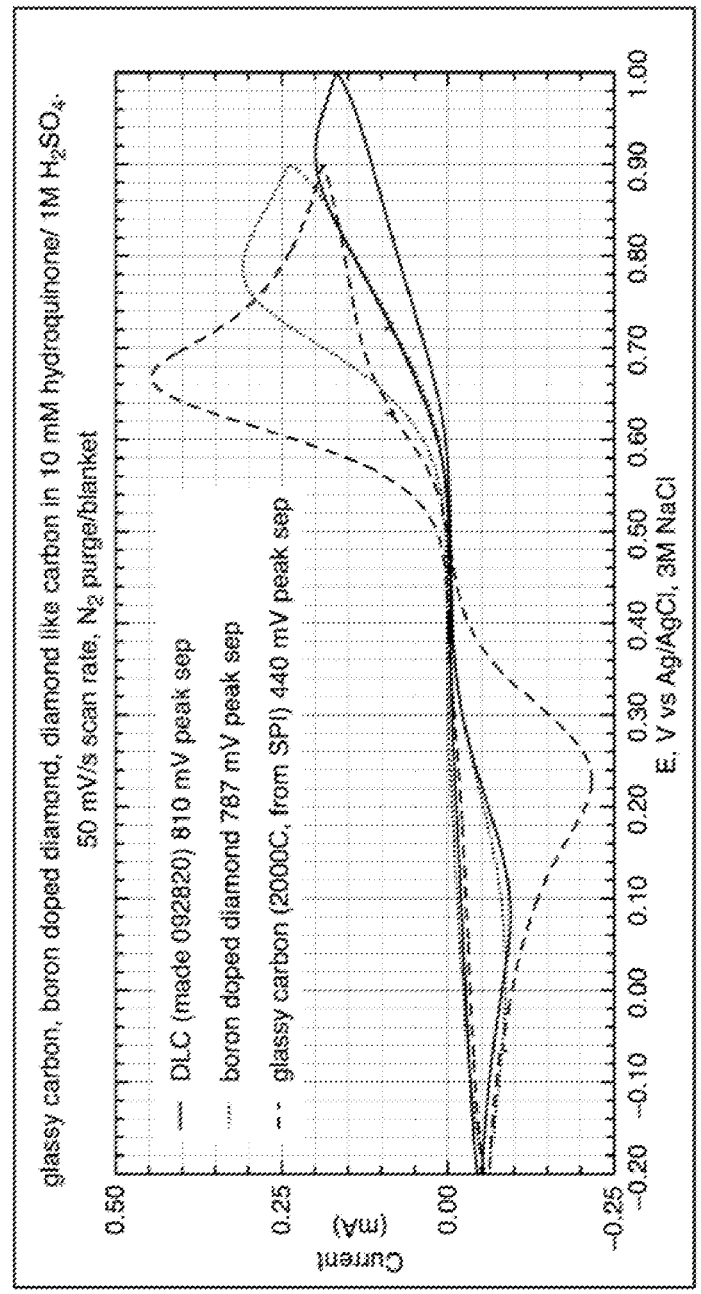
FIG. 6 illustrates a cyclic voltammogram using hydroquinone for the first set of examples that were also tested in FIG. 4, including the first glassy carbon, the first boron doped diamond and the first N-DLC material of the present technology.

FIG. 6 shows a cyclic voltammogram using hydroquinone for the glassy carbon, boron doped diamond and N-DLC of the present technology that were also tested in FIG. 5. As shown, the reaction for boron doped diamond requires a greater voltage spread than the reaction for glassy carbon, and the reaction for the N-DLC requires a greater voltage spread than the reaction for the boron doped diamond. Indeed, diamond-like carbon electrode materials tend to show almost no current from about 0.25 to about 0.6 volts on the graph. These results indicate that the N-DLC is more irreversible than the glassy carbon.

Diamond-like carbon materials of the present technology can be used in many applications. As discussed above, in at least some embodiments, diamond-like carbon materials of the present technology may be used in an air electrode of a lithium air battery. In such examples, materials of the present technology have been found to perform better on discharge than diamond, and to perform on recharge at least as well as diamond. Additionally, diamond-like carbon materials of the present technology can be used in neural implants, both with respect to sensing and stimulation. Diamond-like carbon materials of the present technology may be advantageous for such applications because of their low background current and electrochemical robustness. Additionally, diamond-like carbon materials of the present technology can be used in electrochemical synthesis to synthesize chemicals using electrodes that include the diamond-like carbon materials. Such an application may take advantage of the electrochemical robustness of the diamond-like carbon materials, and the higher overpotential of the diamond-like carbon materials for solvent breakdown versus their overpotential for desired reactions.

EXAMPLES

First Example

In a first test using cyclic voltammetry, it has been shown that a DLC of the present technology has a lower propensity, more than any other known electrode material, on recharge, to break down a typical solvent/electrolyte used for Li air batteries.

Figure 7:
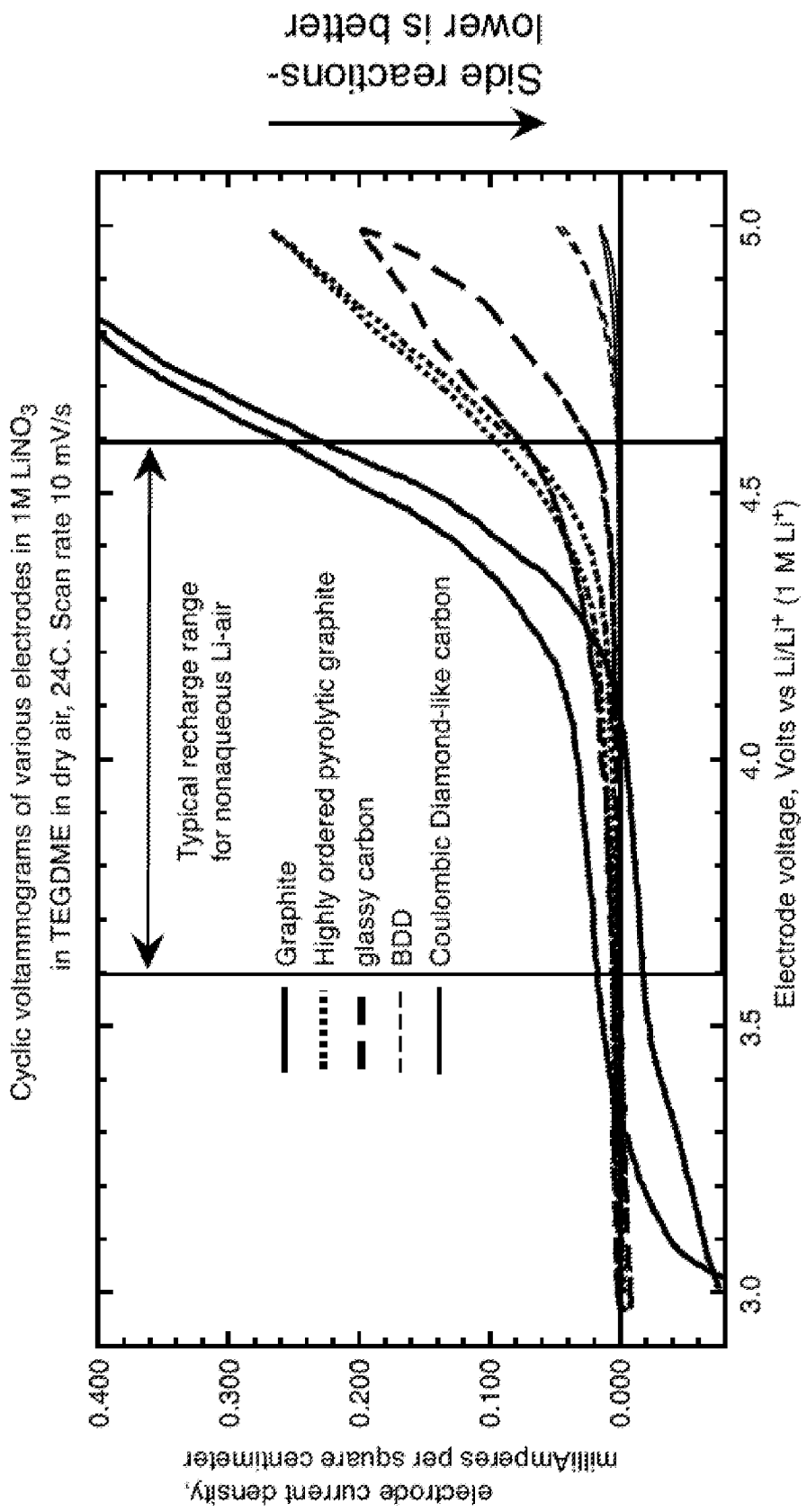
FIG. 7 illustrates the graphed results of cyclic voltammetry performed on a second diamond-like carbon of the present technology in tetraethylene glycol dimethyl ether (TEGDME) containing 1 molar lithium nitrate as an electrolyte, in dry air.

Cyclic voltammetry was performed in tetraethylene glycol dimethyl ether (TEGDME) containing 1 molar lithium nitrate as an electrolyte, in dry air. The potential was swept to 5V vs $Li/Li_+$, which are conditions a Li air battery may experience during recharge. The results are shown in the graph of FIG. 7. As can be seen in FIG. 7, the solvent breakdown current is far lower for boron doped diamond and the DLC of the present technology than other carbonaceous electrode materials.

Figure 8:
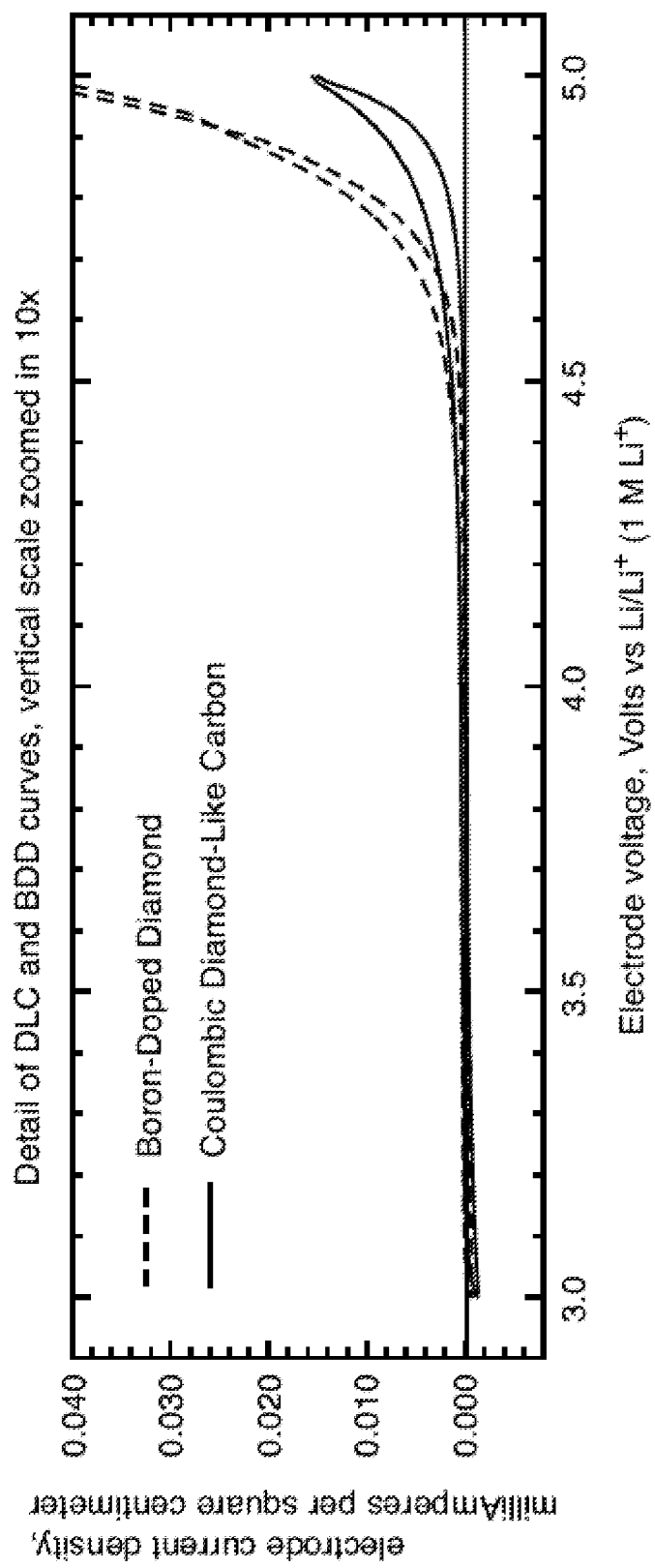
FIG. 8 illustrates a ten times enlargement of the vertical scale of FIG. 6.

FIG. 8 shows a ten times enlargement of the vertical scale of FIG. 7, and shows only the results for boron doped diamond and the DLC of the present technology. The DLC of the present technology shows significantly less solvent breakdown than even boron doped diamond.

Figure 9:
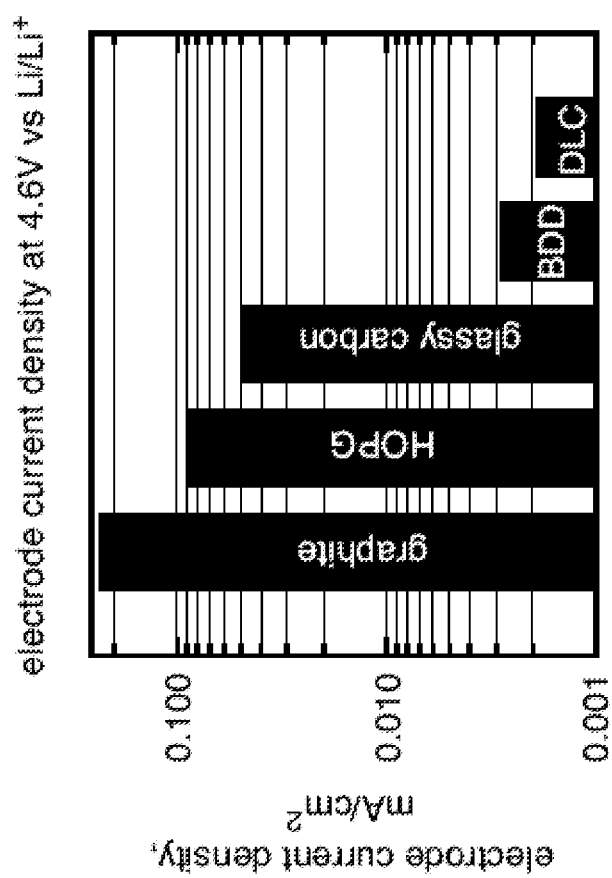
FIG. 9 illustrates a bar graph showing solvent breakdown current at 4.6V on a logarithmic scale.

FIG. 9 is a bar graph showing solvent breakdown current at 4.6V on a logarithmic scale. FIG. 9 shows that the boron doped diamond and the DLC of the present technology are far less damaging to the solvent and electrolyte of this system than other electrode materials, with the DLC of the present technology being better than boron doped diamond by more than a factor of two.

Second Example

In a second test using cyclic voltammetry with rotating ring-disk electrodes in a typical solvent/electrolyte systems for Li air, it has been shown that a DLC of the present technology has comparable and reasonable behavior as compared to boron doped diamond or glassy carbon.

On discharge, a lithium air battery ideally reduces oxygen from the air to lithium peroxide, an insoluble white material:

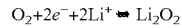

$$O_2 + 2e^- + 2Li^+ \rightleftharpoons Li_2O_2$$

Some of the oxygen only gets reduced to the superoxide, which is soluble in some solvents:

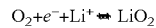

$$O_2 + e^- + Li^+ \rightleftharpoons LiO_2$$

A rotating ring-disk electrode has liquid continuously flowing, from the disk to the ring, so a reduction of oxygen to the superoxide on the disk can be detected by a corresponding oxidation of the superoxide on the ring. If the cell and solution is purged with argon gas, so as to exclude any oxygen or water from the system, an ideal electrode would show no reactions at all under discharge conditions for a lithium air battery, as there is no oxygen available to be reduced. In practice, all electrodes and solvent/electrolyte systems do have some side reactions, as was the case on recharge.

Rotating ring/disk voltammograms were created using graphite, glassy carbon, BDD and DLC of the present technology disks, all with graphite rings, in DMSO (dimethyl sulfoxide)/lithium nitrate and TEGDME/lithium nitrate. The results are shown in FIGS. 10 and 11.

Figure 10:
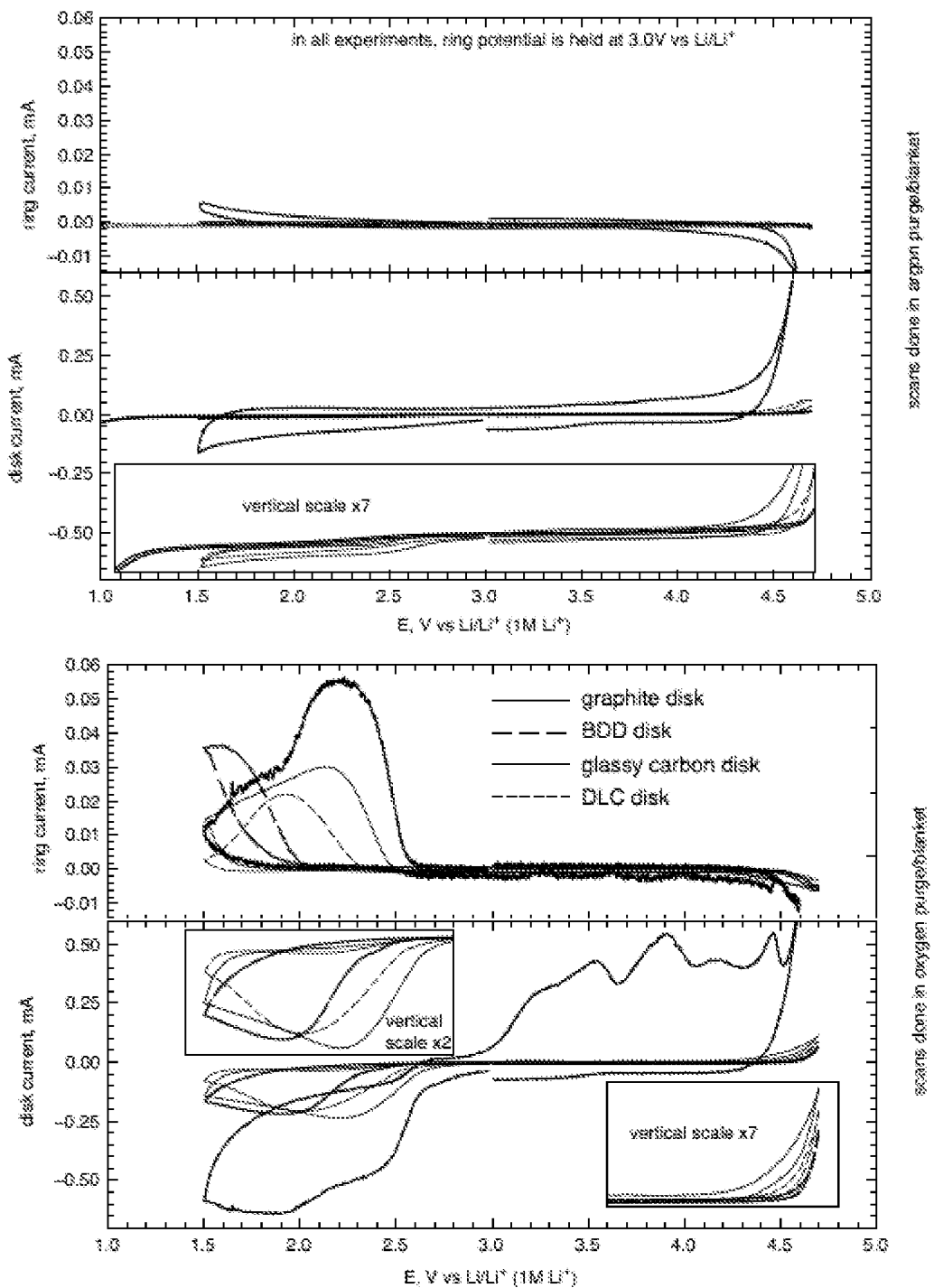
FIG. 10 illustrates rotating ring disk electrode voltammograms in $DMSO/LiNO_3$, created using a first graphite, a second glassy carbon, a second boron doped diamond, and a third diamond-like carbon of the present technology, the views on top were done with argon purge, and the bottom views were done with pure oxygen purge.

FIG. 10 illustrates rotating ring disk electrode voltammograms in $DMSO/LiNO_3$, created using a first graphite, a second glassy carbon, a second boron doped diamond, and a third diamond-like carbon of the present technology, the views in the top graph were done with argon purge, and the bottom views were done with pure oxygen purge. FIG. 11 illustrates rotating ring/disk voltammograms were in TEGDME/lithium nitrate, created using a third graphite, a fourth glassy carbon, a third boron doped diamond, and a fourth diamond-like carbon of the present technology, the top views were done with argon purge, and the bottom views were done with pure oxygen purge.

Figure 11:
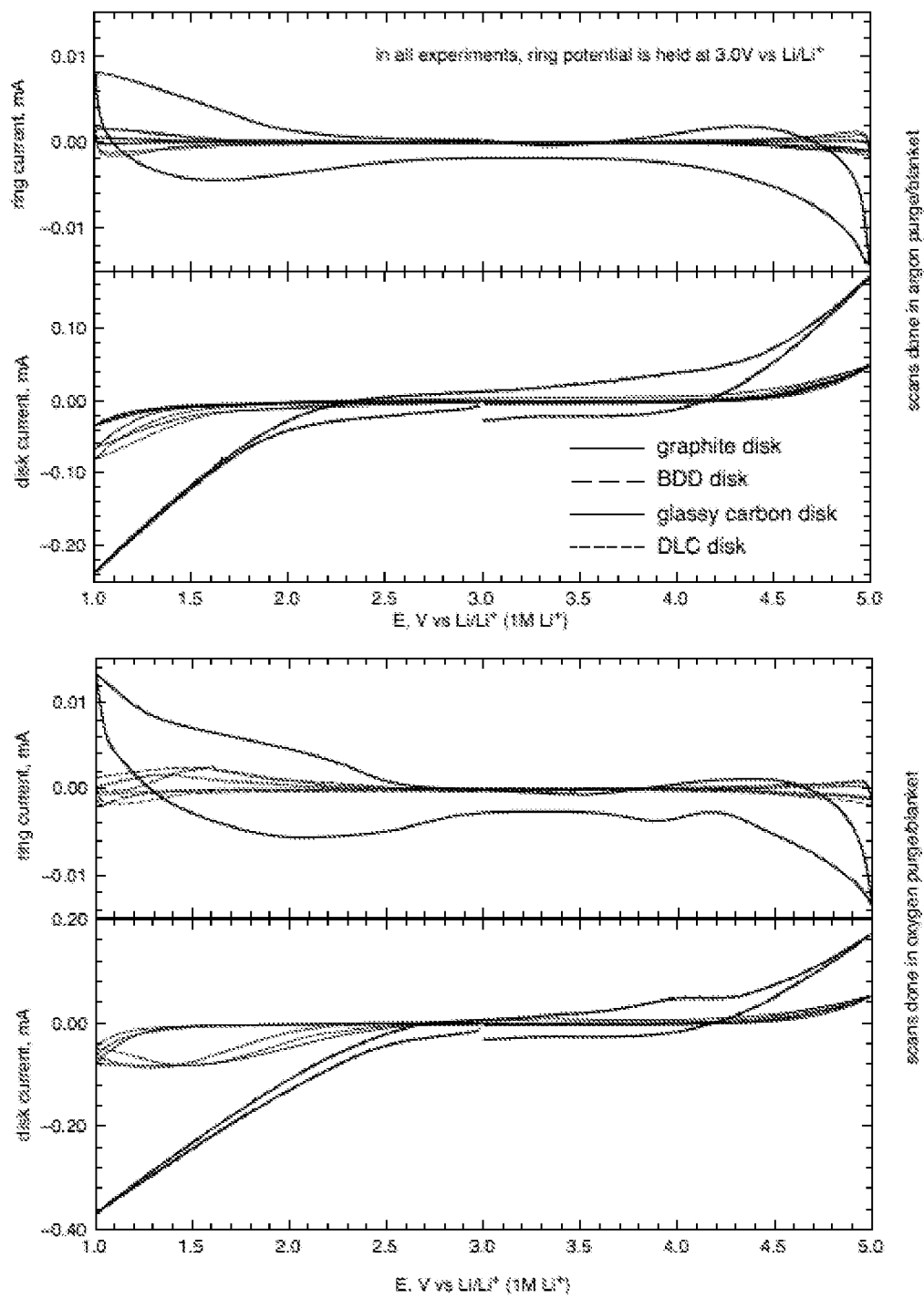
FIG. 11 illustrates rotating ring/disk voltammograms were in TEGDME/lithium nitrate, created using a third graphite, a fourth glassy carbon, a third boron doped diamond, and a fourth diamond-like carbon of the present technology, the top views were done with argon purge, and the bottom views were done with pure oxygen purge.

The voltammograms in the top graphs of FIGS. 10 and 11 were done with a pure argon purge, so flatter curves on both the ring and the disk are desired. The voltammograms shown in the bottom graphs of FIGS. 10 and 11 were done with a pure oxygen purge, so curves that show both an increase in reduction current on the disk (lower values) along with a corresponding increase in oxidation current on the ring (oxidation of superoxide), below 2.5 volts, show advantageous behavior. As shown, the graphite disk electrode shows the highest current both in argon and oxygen. None of the ring electrodes display a significant oxidation current, indicative of oxidation of superoxide in argon. In oxygen, all disk electrodes showed an increased reduction current, but only the GC, BDD and DLC electrodes generated a product that got picked up on the rings as an oxidation current in proportion to their reduction current. Overall, the GC, BDD and DLC electrodes are exhibiting desired properties, while the Graphite is not. The Graphite is likely doing undesirable side reactions both in argon and oxygen.

Third Example

A set of example materials were tested. The set of materials included a glassy carbon, a boron doped diamond, and three samples of diamond-like carbon (DLC) that were made using different sputtering parameters. The first DLC was made using 3% nitrogen. The second and third DLCs were each made with 100% nitrogen, but the second DLC was made outside of the plasma column and the third DLC was made above the plasma column.

Figure 12:
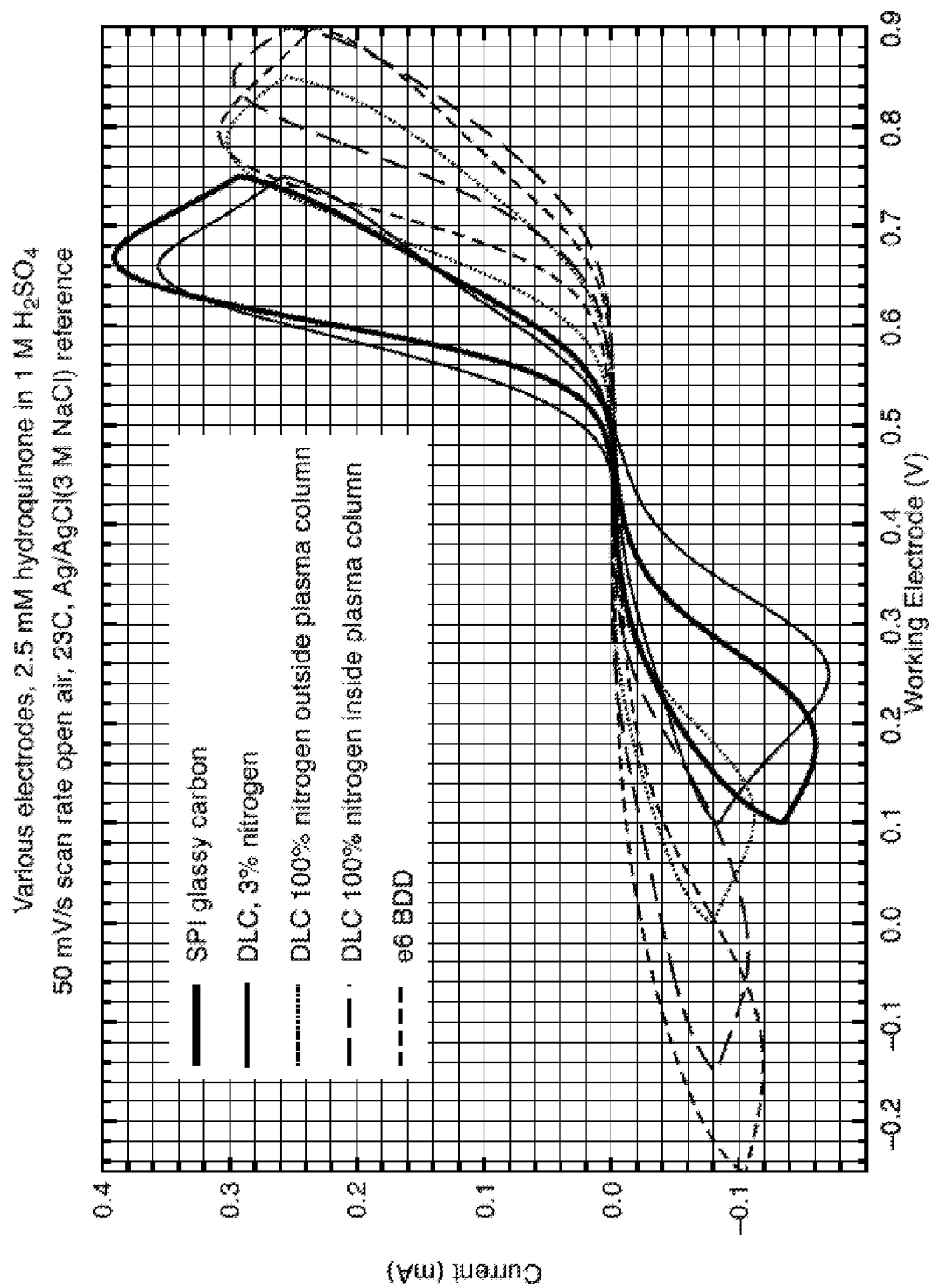
FIG. 12 illustrates a cyclic voltammogram using hydroquinone for a second set of example materials, including a fifth glassy carbon, a fourth boron doped diamond, three samples of diamond-like carbon made using various sputtering parameters.

FIG. 12 illustrates a cyclic voltammogram using hydroquinone for the tested materials. The curve for the glassy carbon is shown in gray, the curve for the boron doped diamond is shown in blue, the curve for the DLC made using 3% nitrogen is shown in red, the curve for the DLC made outside the plasma column is shown in green, and the curve for the DLC made above the plasma column is shown in purple.

The DLC using 3% nitrogen is not a DLC of the present technology. It fails this test because it does not have an overpotential such that a series of voltammograms have a peak separation when extrapolated to a scan rate of zero that is greater than about 500 millivolts. Indeed, the DLC using 3% nitrogen shows oxidation and reduction peaks with less separation than the glassy carbon.

The two DLCs made using 100% nitrogen pass this test because they do have an overpotential such that the voltammograms for those materials have a peak separation when extrapolated to a scan rate of zero that is greater than about 500 millivolts. As can be seen, the oxidation and reduction peaks for both are separated by significantly more than glassy carbon, which is advantageous. Their oxidation peaks are at potentials near or in excess of boron doped diamond. Furthermore, the curve for the DLC made outside the plasma column shows a reduction peak that is more reversible than boron doped diamond, which is advantageous. The high oxidation overpotential, and the reduction overpotential that is lower than boron doped diamond are desirable properties.

Figure 13:
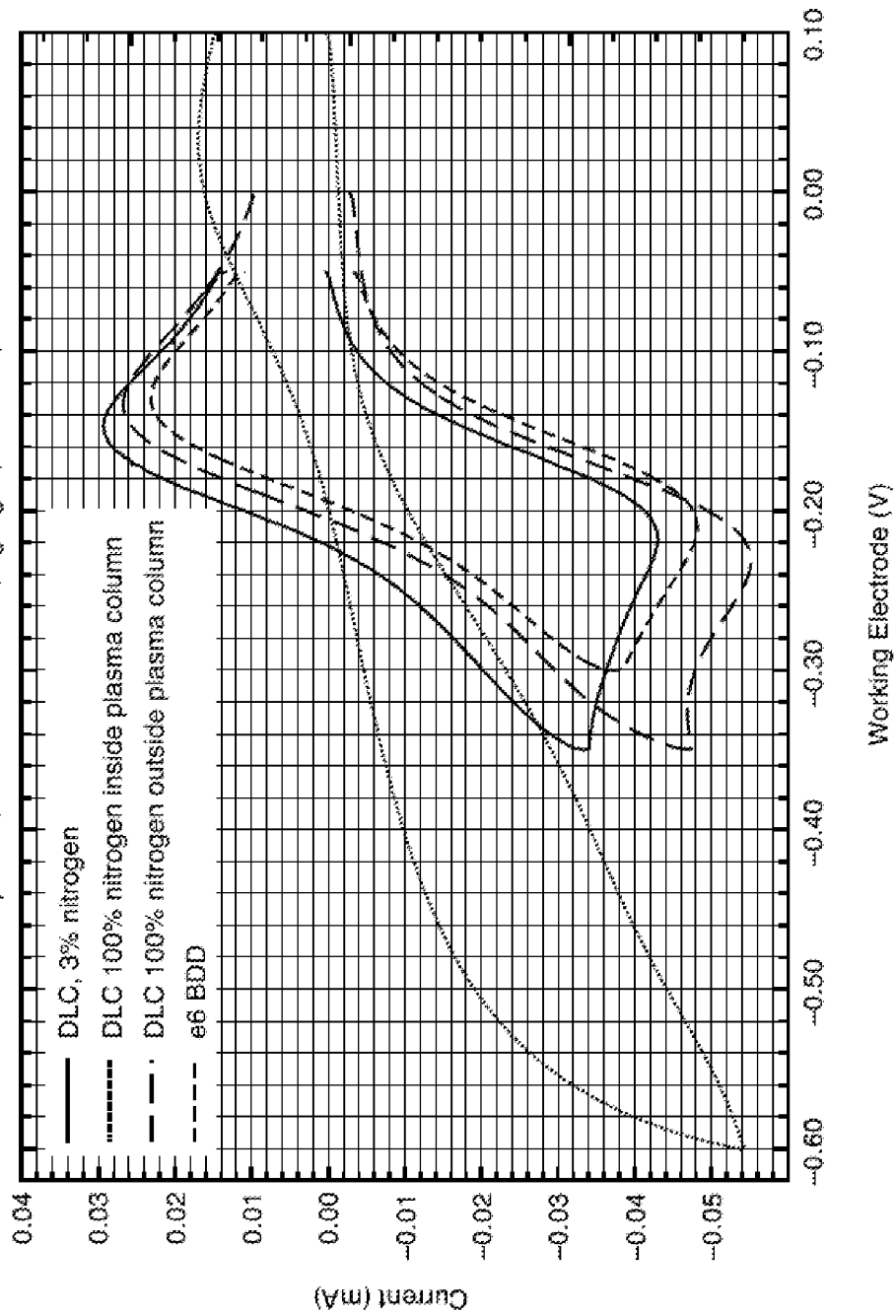
FIG. 13 illustrates a cyclic voltammogram using ruthenium hexaamine cation for the second set of example materials that were also used in FIG. 12.

FIG. 13 illustrates a cyclic voltammogram using ruthenium hexaamine cation for the second set of example materials that were also used in FIG. 12. As discussed above, this test determines if the material when used as an electrode is conductive and shows fast, reversible kinetics with respect to a canonical outer-sphere redox couple.

As shown, the boron doped diamond electrode and two of the 3 DLC electrodes show reversible behavior, as indicated by the small separation between the oxidation and reduction peak potentials, all less than 100 mV. The curve in purple, representing the DLC made above the plasma column and with 100% nitrogen shows very sluggish kinetics and does not pass this test.

Therefore, the only DLC out of the three tested that meets the requirements to be a DLC of the present technology is the DLC made outside the plasma column and with 100% nitrogen. This DLC has the requisite combination of low resistance as well as desired kinetics towards inner sphere reactions, such as hydroquinone.

Fourth Example

Figure 14:
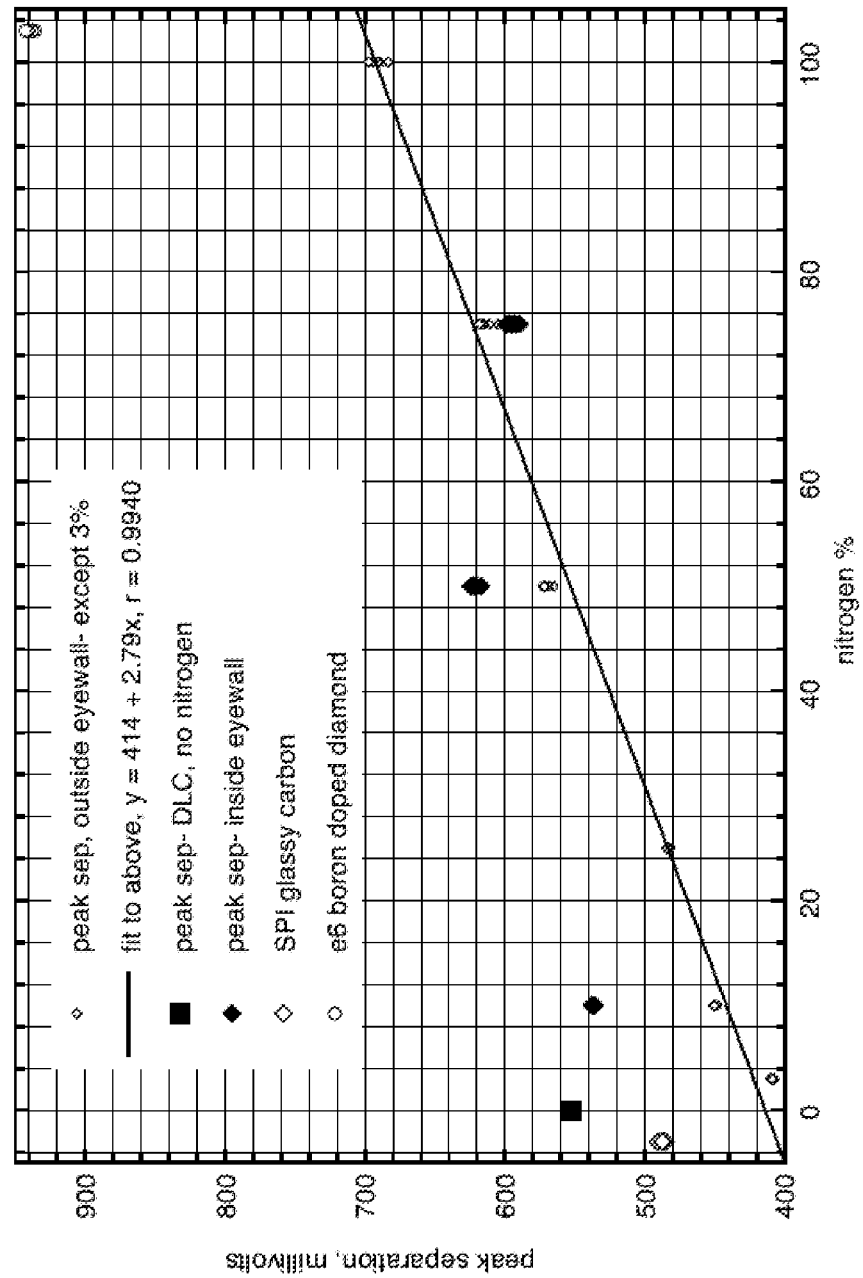
FIG. 14 illustrating a graph of peak separation v. % nitrogen for a set of diamond like carbon samples made with varying amounts of nitrogen during the sputtering process.

In this example, a set DLC films were made with various fractions of nitrogen in the vacuum chamber constituting the sputtering gases. FIG. 14 provides a graph of the peak separation v. % nitrogen for the set of DLC films.

Some of these films exhibited a spot in the middle, likely due to the higher ionization directly above the plasma column of the unbalanced magnetron. Results from films that exhibited this appearance and also were determined to be low resistance based on reversible behavior with ruthenium hexamine are included, denoted as "above plasma column." Of the 3 films that showed a central spot, and had acceptably low resistance, the 10% and 50% nitrogen fraction films showed a significantly higher overpotential above plasma column as compared to outside plasma column on the same film. Inside and outside plasma column on the 75% film were about the same. The 100% nitrogen plasma film had a central spot above the plasma column, and was used in the Third Example described above (purple curve). As can be seen in FIG. 13, it had an unacceptably high resistance and did not qualify as being a DLC of the present technology.

Methods

Figure 15:
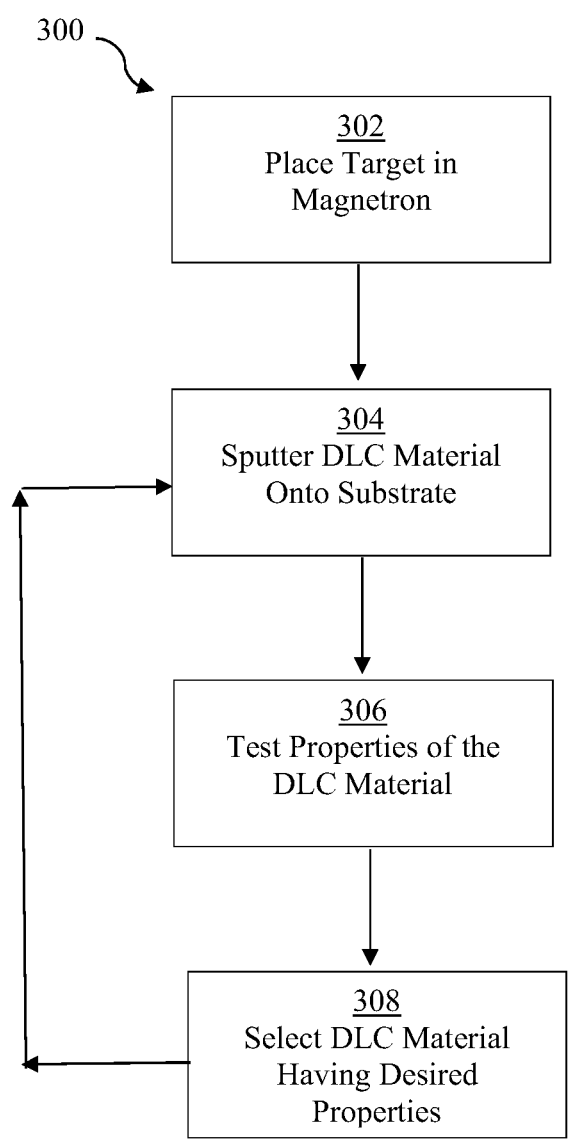
FIG. 15 illustrates a flow chart of one example of a method of making diamond-like carbon materials of the present technology.

FIG. 15 illustrates one example of a method 300 of making diamond-like carbon materials of the present technology. The method 300 starts at step 302. Which includes placing a graphite target in DC magnetron located in a vacuum chamber. The method may also include setting the DC magnetron to be unbalanced prior to sputtering. The method may proceed to step 304, which includes sputtering material from the target onto a substrate using a sputtering gas to create a sputtered diamond-like carbon material. The sputtering gas may contain argon and a dopant. In some examples, the dopant may be nitrogen. In such examples, the amount of nitrogen in the sputtering gas may be at least about 50%, or any of the amounts of nitrogen discussed above. The method may also include maintaining the vacuum chamber at a desired sputtering pressure during sputtering. The sputtering pressure may be maintained at about 5 millitor during sputtering. The substrate may be made of any suitable material, and in some examples may be aluminum or silicon.

The method may proceed to step 306, which includes testing the properties of the sputtered diamond-like carbon material. The testing may include testing the electrical conductivity of the sputtered diamond-like material by conducting cyclic voltammetry using ruthenium hexaamine cation, and the overpotential of the sputtered diamond-like material by conducting cyclic voltammetry using hydroquinone. The method may proceed to step 308, which includes selecting sputtered diamond-like carbon material having desired properties. The selecting may include selecting sputtered diamond-like material having (1) electrical conductivity such cyclic voltammetry using ruthenium hexaamine cation displays a peak separation when extrapolated to a scan rate of zero that is below about 100 millivolts, (2) overpotential such that cyclic voltammetry using hydroquinone displays a peak separation when extrapolated to a scan rate of zero that is greater than about 500 millivolts, and (3) electrochemical robustness such that for evolution of chlorine in concentrated hydrochloric acid having a concentration of at least about 37%, it is at least about 1000 times more durable than graphite.

In practice, the above method may be used in an interactive process to make diamond-like carbon materials under varying conditions, and the results of the testing may be used to adjust the parameters of the synthesis equipment and process in order to consistently produce diamond-like carbon materials of the present technology.

From the foregoing, it will be appreciated that although specific examples have been described herein for purposes of illustration, various modifications may be made without deviating from the spirit or scope of this disclosure. It is therefore intended that the foregoing detailed description be regarded as illustrative rather than limiting, and that it be understood that it is the following claims, including all equivalents, that are intended to particularly point out and distinctly claim the claimed subject matter.

What is claimed is:

1. A diamond-like carbon material having:
   electrical conductivity such that graphed results of cyclic voltammetry using ruthenium hexaamine cation having a peak separation when extrapolated to a scan rate of zero that is below about 100 millivolts;
   overpotential such that graphed results of cyclic voltammetry using hydroquinone having a peak separation when extrapolated to a scan rate of zero that is greater than about 500 millivolts; and
   electrochemical robustness such that for evolution of chlorine in concentrated hydrochloric acid having a concentration of at least about 37%, the diamond-like carbon material is at least about 1000 times more durable than graphite.

2. The diamond-like carbon material of claim 1, wherein the diamond-like carbon material has a solvent breakdown current at 4.6V vs Li/Li+ in tetraethylene glycol dimethyl ether/lithium nitrate of less than 2 $\mu A/cm^2$ in dry air.

3. The diamond-like carbon material of claim 1, has an onset of oxygen reduction in DMSO/LiNO3 in dry oxygen of 2.4V or above vs Li/Li+.

4. The diamond-like carbon material of claim 1, has an onset of oxygen reduction in tetraethylene glycol dimethyl ether/LiNO3 in dry oxygen of 2.4V or above vs Li/Li+.

5. A method of making diamond-like carbon material, the method comprising steps of:
   placing a graphite target in a DC magnetron located in a vacuum chamber; and
   sputtering DLC material from the target onto a substrate using a sputtering gas containing argon and dopant to create a sputtered diamond-like carbon material;
   testing the electrical conductivity of the sputtered diamond-like carbon material by conducting cyclic voltammetry using ruthenium hexaamine cation, and the overpotential of the sputtered diamond-like material by conducting cyclic voltammetry using hydroquinone; and
   selecting sputtered diamond-like carbon material having (1) electrical conductivity such cyclic voltammetry using ruthenium hexaamine cation displays a peak separation when extrapolated to a scan rate of zero that is below about 100 millivolts, (2) overpotential such that cyclic voltammetry using hydroquinone displays a peak separation when extrapolated to a scan rate of zero that is greater than about 500 millivolts, and (3) electrochemical robustness such that for evolution of chlorine in concentrated hydrochloric acid having a concentration of at least about 37%, it is at least about 1000 times more durable than graphite.

6. The method of claim 5, further comprising a step of:
   setting the DC magnetron to be unbalanced prior to sputtering.

7. The method of claim 5, wherein the dopant is nitrogen and the amount of nitrogen is at least about 50%.

8. The method of claim 5, further comprising a step of:
   maintaining the vacuum chamber at a pressure of about 5 millitor during sputtering.

* * * * *